United States Patent [19]
Yamada

[11] Patent Number: 5,967,858
[45] Date of Patent: Oct. 19, 1999

[54] POWER MODULE

[75] Inventor: Toshifusa Yamada, Nagano, Japan

[73] Assignee: Fuji Electric Co., Ltd., Kawasaki, Japan

[21] Appl. No.: 08/987,087

[22] Filed: Dec. 9, 1997

[30] Foreign Application Priority Data

Dec. 10, 1996 [JP] Japan .................................. 8-329421

[51] Int. Cl.$^6$ .................................................. H01R 13/405
[52] U.S. Cl. ........................................... 439/736; 439/212
[58] Field of Search ..................................... 439/885, 212, 439/876, 949, 736, 83; 29/848, 856, 883

[56] References Cited

U.S. PATENT DOCUMENTS 5,104,324  4/1992  Grabbe et al. .............................. 439/83

FOREIGN PATENT DOCUMENTS 61-84047  4/1986  Japan .

*Primary Examiner*—Michael L. Gellner
*Assistant Examiner*—Antoine Ngandjui
*Attorney, Agent, or Firm*—Kanesaka & Takeuchi

[57] ABSTRACT

A power module is basically formed of a circuit block, a resin casing surrounding the circuit block, and circuit terminals. The circuit block has a metal base, an insulative substrate disposed on the metal base, and a plurality of circuit parts mounted on the insulative substrate. The resin casing is connected to a periphery of the metal base. The circuit terminals have terminal frames at least partly molded in the resin casing. At least one of the terminal frames has an insertion hole therein to receive an insert pin of a mold. Thus, one of the terminal frames is held in position in the mold by the insert pin of the mold during molding. The power module has an improved terminal wiring structure which stabilizes the quality and improves the reliability of the integral resin casing incorporated with the terminals inserted to the resin casing by insert-molding.

9 Claims, 3 Drawing Sheets

POWER MODULE

BACKGROUND OF THE INVENTION AND RELATED ART STATEMENT

The present invention relates to a power module which uses a power semiconductor device such as an insulated gate bipolar transistor (IGBT) for a switching device. More specifically, the present invention relates to a terminal wiring structure of the power module.

A conventional power module disclosed in the Japanese Patent Publication (KOKAI) No. H07-321285 includes a circuit block, a metal base, an integral resin casing, a casing cover and a sealing resin. The circuit block includes an insulative substrate such as a ceramic substrate on which circuit parts and components including a power semiconductor device such as an IGBT are mounted. The metal base is laminated on the back surface of the circuit block. The integral resin casing surrounds the circuit block and is bonded with adhesives to the periphery of the metal base. The integral resin casing is integrally united with lead-out terminals such as main terminals and auxiliary terminals. The main terminals include a collector terminal and an emitter terminal. The auxiliary terminals include auxiliary signal terminals for the emitter and gate. The integral resin casing is formed, by insert-molding, integrally with the terminal frames of the main and auxiliary terminals inserted thereto. Inner leads extend from the terminal frames and are wired inside the resin casing. The end sections of the inner leads are soldered to a circuit pattern on the substrate of the circuit block.

In another conventional power module which includes an integral resin casing formed, by insert-molding, integrally with lead-out terminals inserted thereto, auxiliary terminals are gathered in a peripheral portion of the resin casing. The terminal frames of the auxiliary terminals are buried in the wall of the resin casing and extended to the vicinity of soldering locations of the circuit block so as no to cross the wiring paths of the bonding wires of the circuit block inside the resin casing so that the terminal frames do not interact with the bonding wires. Inner leads extend inwardly from the terminal frames to the soldering locations, and the end sections of the inner leads are soldered to the substrate of the circuit block.

FIGS. 5(a) and 5(b) show the external appearance of the conventional power module including two IGBTs connected in series. FIG. 6 is an equivalent circuit of the power module of FIGS. 5(a) and 5(b). Referring now to FIGS. 5(a) and 5(b), the reference numeral 1 designates an integral resin casing integrally united with a lead-out terminal; numeral 2 is a casing cover; numeral 3 is a metal base on the bottom of the resin casing; numeral 4 is a main circuit terminal; and numeral 5 is an auxiliary signal terminal. The main circuit terminals 4 are led outside through the casing cover 2. The auxiliary terminals 5 are gathered on a peripheral portion of the resin casing 1. Each terminal is soldered to the substrate of a circuit block (not shown) mounted inside the resin casing such that the equivalent circuit of FIG. 6 is formed.

Referring now to FIG. 6, the symbol Tr1 designates an IGBT; Tr2 is another IGBT; and D is a free-wheeling diode connected parallel to the IGBT. The IGBTs Tr1 and Tr2 are mounted on the circuit block. The main circuit terminals 4 and the auxiliary terminals 5 are further designated by the terminal symbols for the collector, emitter and gate such as C1, E2, C2E1, G1, E1, G2 and E2.

The conventional internal wiring structure described above has the following problems in manufacturing and reliability.

The integral resin casing is formed through the steps of inserting the terminal frames for the main terminals and auxiliary terminals in the predetermined positions of a molding die, closing the molding die and supplying a molding resin through a gate of the molding die. The molding pressure which reaches 300 to 400 kg/cm$^2$ may cause the inserted terminal frames to move from the predetermined positions or may deform the terminal frames. Especially, the auxiliary terminal frame in the form of a strip and buried in the wall of the resin casing is easily deformed under the molding pressure.

The middle portion of the auxiliary terminal frame inserted in the wall of the resin casing may be pushed to the outside of the casing wall and exposed. Or, the terminal frames for the terminals with opposite polarities may contact with each other in the resin layer of the casing. The exposed terminal frame or the short-circuited terminal frames are molding defects. The deformation of the terminal frame further causes random displacement of the end sections of the inner leads extending inside the casing from the predetermined soldering positions. The displaced inner leads are hazardous for soldering and cause problems in assembling the power module.

In addition, since the materials for the resin casing, metal base, ceramic insulative substrate, terminal frames and semiconductor devices exhibit different thermal expansion coefficients, thermal stress is exerted to the bonding portions of the constituent parts and components by the heat cycles due to the current carrying operations of the semiconductor devices. Especially, when the thermal stress is exerted repeatedly to the soldered portions of the end section of the inner lead and the wiring pattern of the circuit block, cracks are formed in the solder layer. As the cracks grow, the soldered faces are completely separated from each other to thereby causes a critical fault such that the semiconductor device stops operating.

In view of the foregoing, it is an object of the invention to provide a stable and reliable power module which obviates the foregoing problems.

It is another object of the invention to provide a power module which has an improved terminal wiring structure.

SUMMARY OF THE INVENTION

According to an aspect of the invention, there is provided a power module which includes a circuit block including a metal base, an insulative substrate laid on the metal base and one or more power semiconductor devices mounted on the substrate; a resin casing surrounding the circuit block, the resin casing being bonded to the metal base and including rib-shaped protrusions protruding inwardly from the inner side face thereof; a casing cover; main circuit terminals, each including a first terminal frame; and auxiliary terminals gathered on a peripheral portion of the resin casing, each of the auxiliary terminals including a second terminal frame having an inner lead extending inwardly from the inner side face of the resin casing, the inner lead including an end section soldered to the substrate of the circuit block. The first terminal frame and the second terminal frame are inserted to the resin casing and integrated with the resin casing. The second terminal frame is laid along the inner side face of the resin casing, half buried in the resin casing and held by the rib-shaped protrusions at their mid portions.

According to another aspect of the invention, there is provided a power module which includes a circuit block including a metal base, an insulative substrate laid on the metal base and one or more power semiconductor devices mounted on the substrate; a resin casing surrounding the circuit block and bonded to the metal base; a casing cover; main circuit terminals, each including a first terminal frame; and auxiliary terminals gathered on a peripheral portion of the resin casing, each of the auxiliary terminals including a second terminal frame having an inner lead extending inwardly from the inner side face of the resin casing, the inner lead including an end section soldered to the substrate of the circuit block. The first terminal frame and the second terminal frame are inserted to the resin casing and integrated with the resin casing. The first terminal frame includes a first pin insertion hole bored in a mid portion thereof for positioning the first terminal frame at a predetermined position with a first insert pin of a molding die for molding the resin casing. The second terminal frame includes a second pin insertion hole bored in a mid portion thereof for positioning the second terminal frame at a predetermined position with a second insert pin of the molding die for molding the resin casing. The second terminal frame includes a protrusion formed in another mid portion thereof and has a third pin insertion hole bored therein for positioning the second terminal frame at the predetermined position with a third insert pin of the molding die. The first, second and third insert pins are inserted respectively into the first, second and third pin insertion holes during molding the resin casing with the first and second terminal frames inserted thereto.

According to still another aspect of the invention, there is provided a method of manufacturing a power module including a circuit block having a metal base, an insulative substrate laid on the metal base, and one or more power semiconductor devices mounted on the substrate; a resin casing surrounding the circuit block and bonded to the metal base; a casing cover; main circuit terminals, each including a first terminal frame; and auxiliary terminals gathered on a peripheral portion of the resin casing, each of the auxiliary terminals including a second terminal frame including an inner lead extending inwardly from the inner side face of the resin casing, the inner lead having an end section soldered to the substrate of the circuit block. The first terminal frame and the second terminal frame are inserted to the resin casing and integrated with the resin casing.

The method comprises the steps of: forming protrusions in mid portions of the first and second terminal frames; boring a first pin insertion hole in the protrusion of the first terminal frame, a second pin insertion hole in the protrusion of another mid portion of the second terminal frame and a third pin insertion hole in the second terminal frame; and inserting a first insert pin of a molding die for molding the resin casing into the first pin insertion hole, a second insert pin of the molding die into the second pin insertion hole and a third insert pin of the molding die into the third pin insertion hole, to position the first and second terminal frames at the respective predetermined positions during molding a resin.

By holding the second terminal frames (auxiliary terminal frames) inserted to the molding die in molding the resin casing of the power module at the predetermined positions along the cavity wall of the molding die with the insert pins of the molding die, the terminal frames are prevented from being deformed under the molding pressure caused by the molding resin poured into the molding die or prevented from being pushed outside the resin casing. The rib-shaped protrusions formed on the inner side face of the resin casing tightly hold the insertion-molded terminal frames along the inner side face of the resin casing so that the terminal frames half buried in the resin casing may not fall out of the resin casing.

According to a further aspect of the invention, there is provided a power module which includes a circuit block including a metal base, an insulative substrate laid on the metal base and one or more power semiconductor devices mounted on the substrate; a resin casing surrounding the circuit block and bonded to the metal base; a casing cover; main circuit terminals, each including a first terminal frame; and auxiliary terminals gathered on a peripheral portion of the resin casing, each of the auxiliary terminals including a second terminal frame including an inner lead extending inwardly from the inner side face of the resin casing. The inner lead includes an end section soldered to the substrate of the circuit block. The first terminal frame and the second terminal frame are inserted to the resin casing and integrated with the resin casing. The end section includes a cutout for releasing thermal stress caused in a soldered face of the end section by heat cycle. Advantageously, the cutout is formed at a position between $\frac{1}{3}L$ and $\frac{1}{2}L$ from a base of the end section, where L is the length of the end section from its base.

In the current carrying operation of the power module, the solder cracks are formed in the solder layer between the end section of the inner lead of the terminal frame and the circuit block by the thermal stress due to the differences of the thermal expansion coefficients of the constituent materials. More in detail, the solder cracks are formed, at first, on the base side of the end section, continuous to the trunk of the inner lead and restrained by the trunk of the inner lead of the terminal frame. And, the solder cracks expand toward the tip of the end section. The cutout formed as described above improves the flexibility of the mid portion of the end section. The present inventor has experimentally confirmed that the solder cracks are prevented from expanding beyond the cutout, since the thermal stress is absorbed by the cutout as the solder cracks expand to the cutout.

By forming the cutout at a position between $\frac{1}{3}L$ and $\frac{1}{2}L$ from the base of the end section, the main circuit current and control signals may flow without problems to the circuit block through the non-defective soldered region between the cutout and the tip of the end section even when the solder cracks have reached the cutout. Thus, the withstanding capability of the power module against the solder cracks is improved.

DETAILED DESCRIPTION OF PREFERRED EMBODIMENTS

Figure 5A:
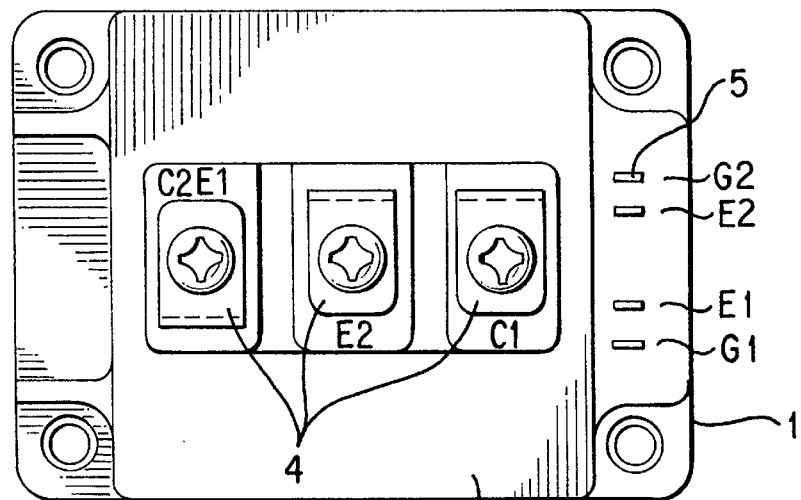
FIGS. 5(a) and 5(b) show external appearances of a conventional power module including two IGBTs connected in series.
Figure 5B:
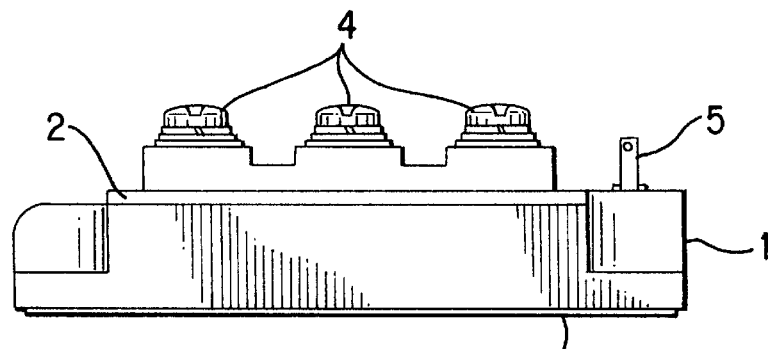
Figure 6:
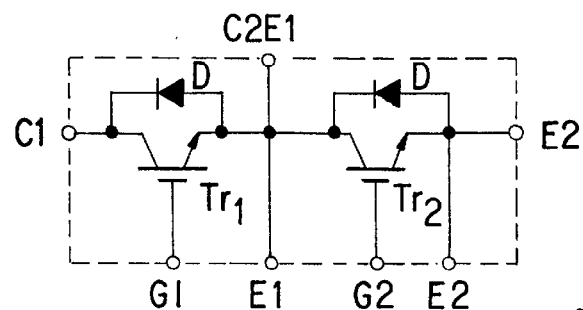
FIG. 6 is an equivalent circuit of the power module of FIGS. 5(a) and 5(b).

Now the present invention will be explained in detail with reference to the accompanied drawings which illustrate the preferred embodiments of the present invention. In the drawings, same parts with those of FIGS. 5(a), 5(b) and 6 are designated by the same reference numerals.

Figure 1:
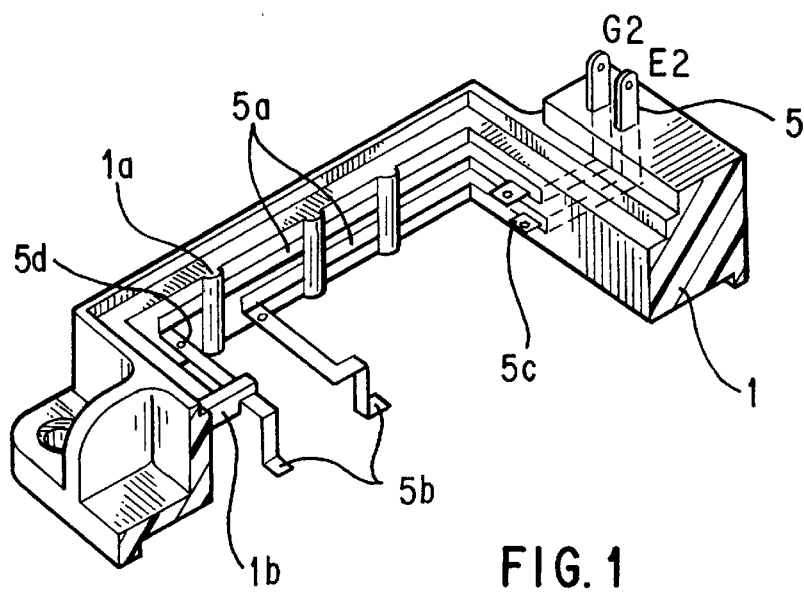
FIG. 1 is a perspective cross sectional view for showing a structure of a resin casing incorporated with terminals according to the invention.
Figure 2:
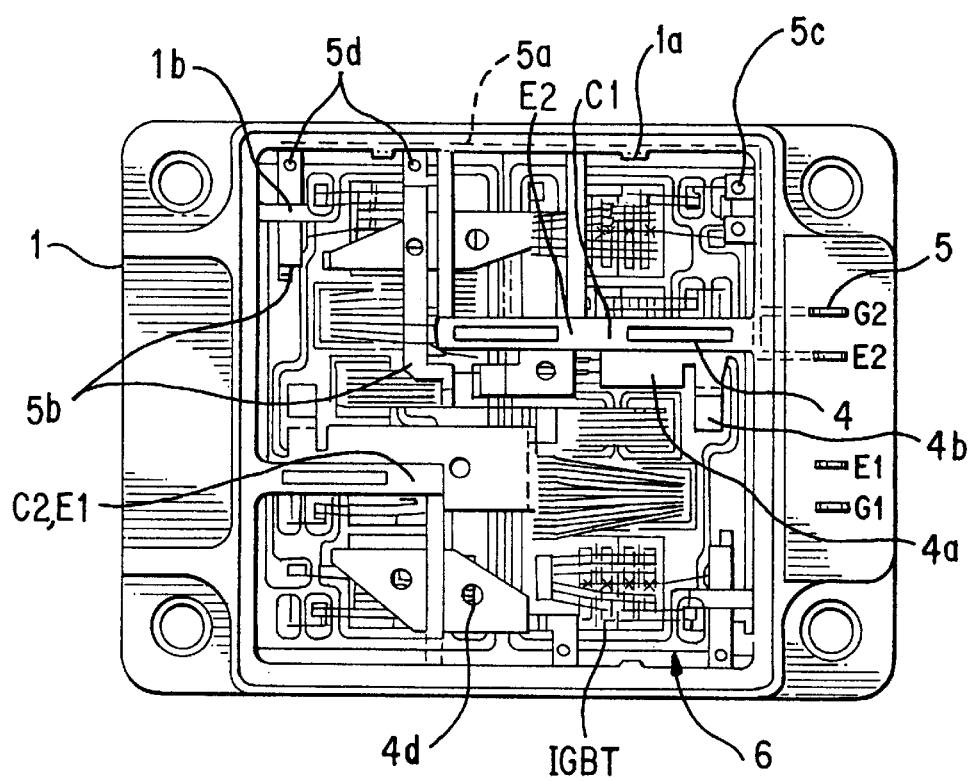
FIG. 2 is a plan view of the power module which uses the resin casing of FIG. 1.

Referring now to FIGS. 1 and 2, auxiliary terminals 5 (G2, E2) are gathered in a peripheral portion of a resin casing 1. The auxiliary terminals G2 and E2 are integrally formed with the resin casing 1 by insert-molding. Terminal frames 5a of the auxiliary terminals G2 and E2 are half buried in the inner side face of the resin casing 1 to extend along the inner side face. An end section 5b of each inner lead protruding inwardly from the resin casing 1 is L-shaped. The L-shaped end section 5b is soldered to a substrate of a circuit block 6. A protrusion 5c protrudes inwardly from the resin casing and has a pin insertion hole bored in a mid portion of the terminal frame 5a. The protrusion 5c is formed as means for positioning and holding the terminal frame 5a at a predetermined position with an insert pin of the molding die for molding the resin casing 1 with the terminal frame 5a inserted therein. A pin insertion hole 5d through which an insert pin of the molding die is inserted is bored through the inner lead as another means for positioning and holding the terminal frame 5a at the predetermined position.

Further, the resin casing 1 includes several rib-shaped protrusions 1a for holding the terminal frames 5a at several locations of the inner side face of the resin casing 1. The resin casing 1 also includes a support arm 1b protruding inwardly from the inner side face thereof for positioning and holding the L-shaped end section 5b of the terminal frame 5a at a predetermined soldering position.

Main circuit terminals 4 are held by insert-molding to a terminal support frame extending inwardly from the side wall of the resin casing 1. A pin insertion hole 4d through which an insert pin of the molding die is inserted is bored in a mid portion of a terminal frame 4a of each main circuit terminal 4 for positioning and holding the terminal frame 4a at a predetermined position with the insert pin in molding the resin casing 1.

Figure 3:
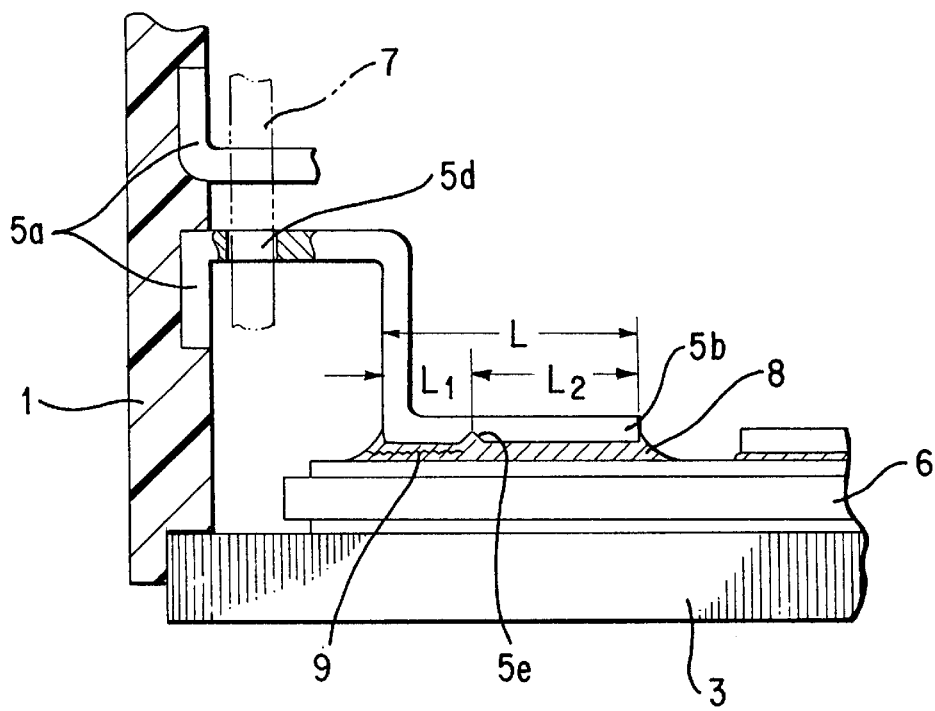
FIG. 3 is a side view showing a structure of an end section of an inner lead, and a soldered portion of the end section of the inner lead and a circuit block.

In molding the resin casing 1 integrally with the main circuit terminals 4 and auxiliary terminals 5, at first, the terminal frames 4a and 5a of the main circuit terminals 4 and auxiliary terminals 5 are inserted to the molding die and positioned at the respective predetermined positions and, then, tightly held at the predetermined positions by inserting insert pins 7 into the pin insertion holes of the protrusions 5c, pin insertion holes 5d and pin insertion holes 4d in the step of closing the molding die as shown also in FIG. 3. The terminal frames 5a of the auxiliary terminals 5 are positioned on the side of the inner cavity wall of the molding die such that the terminal frames 5a are overlaid on the cavity wall of the molding die. Then, the resin casing 1 in FIGS. 1 and 2 incorporated with the terminals is formed by supplying the molding resin through the gate of the molding die.

Figure 4A:
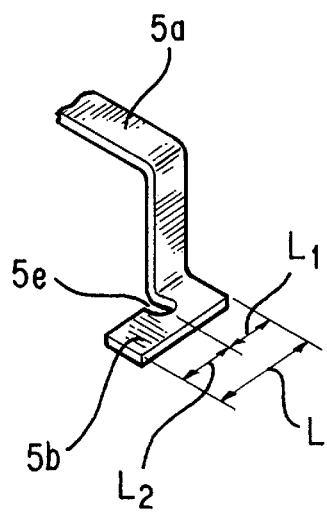
FIG. 4(a) is a different structure of an end section of an inner lead having one cutout portion.
Figure 4B:
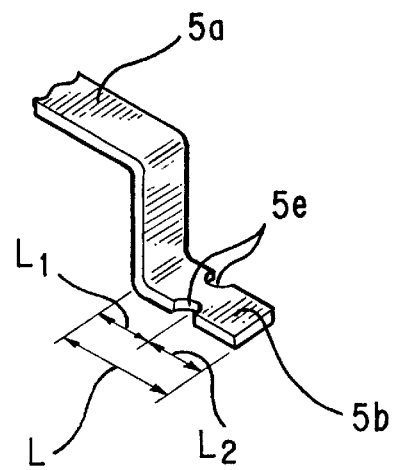
FIG. 4(b) is a still different structure of an end section of an inner lead having two cutout portions.

Referring now to FIGS. 3, 4(a) and 4(b), modifications of the end sections 5b of the inner leads for soldering the auxiliary terminals 5 to the substrate of the circuit block will be explained.

A cutout or groove 5e for releasing the thermal stress is formed in the soldering face in a mid portion in the longitudinal direction of the end section 5b of the inner lead. The reference numeral 8 designates a solder layer. The cutout 5e is formed in the bottom surface of the end section 5b. Or, a cutout 5e may be formed on a side edge of the end section 5b as shown in FIG. 4(a), or two cutouts 5e may be formed on both side edges of the end section 5b as shown in FIG. 4(b). It is preferable to set the position L1 of the cutout 5e from the base portion of the end section 5b at $\frac{1}{3}$L to $\frac{1}{2}$L, wherein L is the length of the end section 5b from its base portion where the end section 5b is continuous to the trunk of the inner lead. And, it is preferable to set the depth of the cutout 5e at $\frac{1}{3}$ to $\frac{1}{2}$ of the thickness of the end section 5b in FIG. 3, or at $\frac{1}{3}$ to $\frac{1}{2}$ of the width of the end section 5b in FIGS. 4(a) and 4(b) so as not to impair the electrical conduction of the end section 5b.

The cutout 5e formed in the soldering face of the end section 5b improves the flexibility of the end section 5b. Even if solder cracks 9 are formed in the solder layer 8 between the end section 5b and circuit block 6 by the thermal stress due to the differences of the thermal expansion coefficients of the constituent materials in the current carrying operations of the power module, the thermal stress will be absorbed by the bending of the end section 5b as the cracks 9 reach the cutout 5e after their gradual expansion from the base portion of the end section 5b. It has been confirmed experimentally by the present inventor that the cracks 9 stop expanding beyond the cutout 5e, since the thermal stress is not exerted any more to the solder layer 8 once after the cracks 9 reach the cutout 5e.

By forming the cutout 5e at $\frac{1}{3}$L to $\frac{1}{2}$L from the base portion of the end section 5b relative to the length L of the end section 5b, the signal is transmitted without problems through the area L2 between the cutout 5e and the tip of the end section 5b where no solder cracks are formed even when the solder cracks expand to the cutout 5e, and withstanding capability of the power module against solder cracks is improved.

By forming a cutout or cutouts in an end section 4b of the terminal frame 4a of the main circuit terminal 4 in the similar manner as described above, the expansion of the solder cracks caused in the solder layer by thermal stress is suppressed.

As described above, the power module according to the invention exhibits the following effects.

In molding the resin casing of the power module, the terminal frames inserted into the molding die are held at the predetermined positions with the insert pins of the molding die, so that the terminal frames are prevented from being deformed under the molding pressure or from being pushed outside the resin casing. The rib-shaped protrusions formed on the inner side face of the resin casing facilitate tightly holding the insertion-molded terminal frames in the inner side face of the resin casing such that the terminal frames half buried in the resin casing may not fall out of the resin casing.

The cutout or groove formed in the end section of the inner lead prevents the solder cracks in the solder layer between the end section of the inner lead and the circuit block from further expansion and improves the withstanding capability of the power module against the solder cracks. Thus, a highly reliable power module which can be assembled easily is obtained according to the invention.

What is claimed is:

1. A power module comprising:
   a circuit block having a metal base, an insulative substrate disposed on the metal base, and a plurality of circuit parts mounted on the insulative substrate;
   a resin casing surrounding the circuit block and connected to a periphery of the metal base; and
   circuit terminals having terminal frames at least partly molded in the resin casing, at least one of said terminal frames having an insertion hole therein, said insertion hole being adapted to receive an insert pin of a mold so that said at least one of said terminal frames is held in position in the mold by the insert pin of the mold during molding.

2. A power module according to claim 1, wherein said circuit terminals include main circuit terminals with main terminal frames, and auxiliary terminals for signals gathered in one area of the resin casing, each of said auxiliary terminals including an auxiliary terminal frame insert-molded in the resin casing and an inner lead section extending from an end of the auxiliary terminal frame inwardly of the resin casing, an end of the inner lead section being soldered to the substrate of the circuit block.

3. A power module according to claim 2, wherein said auxiliary terminal frames are partially molded in the resin casing, and said resin casing includes a plurality of ribs protruding inwardly of the resin casing to completely hold parts of the auxiliary terminal frames.

4. A power module according to claim 2, wherein said resin casing further includes at least one support arm for holding at least one of the auxiliary terminal frames extending inwardly from the resin casing.

5. A power module according to claim 2, wherein said main terminal frames include inner ends, at least one of said inner ends of the main terminal frames and the auxiliary terminal frames having at least one groove therein so that thermal stress applied between a soldered portion and the at least one of the inner ends is released.

6. A power module comprising:
   a circuit block having a metal base, an insulative substrate disposed on the metal base, and a plurality of circuit parts mounted on the insulative substrate;
   a resin casing surrounding the circuit block and connected to a periphery of the metal base, said resin casing having a plurality of ribs protruding inwardly of the resin casing;
   main circuit terminals with main terminal frames attached to the circuit block and partly insert-molded in the resin casing; and
   auxiliary terminals for signals gathered in one area of the resin casing, said auxiliary terminals including auxiliary terminal frames partly insert-molded in the resin casing along an inner peripheral wall of the resin casing and held completely in part by the ribs formed in the resin casing, and inner lead sections extending from respective ends of the auxiliary terminal frames inwardly of the resin casing, inner ends of the inner lead sections being soldered to the substrate of the circuit block.

7. A power module according to claim 6, wherein
   said main terminal frames include inner ends, at least one of said inner ends of the main terminal frames and the inner lead sections having at least one groove therein so that thermal stress applied between a soldered portion and the at least one of the inner ends by a heat cycle is released.

8. A power module according to claim 7, wherein said at least one groove is one of a dent extending from a bottom surface of the inner end facing the metal base, and at least one side notch formed at a portion away from a frame portion of one of the main and auxiliary terminal frames.

9. A power module according to claim 7, wherein said at least one groove is a side notch formed in the inner end at a position between ⅓L and ½L away from a frame portion of one of the main and auxiliary terminal frames, said L being a length of said inner end.

* * * * *

UNITED STATES PATENT AND TRADEMARK OFFICE
CERTIFICATE OF CORRECTION

PATENT NO : 5,967,858
DATED : October 19, 1999
INVENTOR(S) : Toshifusa Yamada

It is certified that error appears in the above-identified patent and that said Letters Patent is hereby corrected as shown below:

In column 1, line 36, change "no" to --not--;

In column 2, lines 25 and 26, change "semiconductor devices" to --power modules--;
        lines 29 and 30, change "semiconductor devices" to --power modules--;
        line 35, change "causes" to --cause--, and change "semiconductor" to --power--;
        line 36, change "device" to --module--.

Signed and Sealed this

Eleventh Day of July, 2000

Attest:

Q. TODD DICKINSON

*Attesting Officer*    *Director of Patents and Trademarks*